May 19, 1953 H. L. DONLEY ET AL 2,639,376

AUTOMATIC FREQUENCY CONTROL

Filed Feb. 25, 1950

INVENTORS
Hugh L. Donley &
Eugene O. Keizer
BY Harry Tunick
ATTORNEY

Patented May 19, 1953 2,639,376

UNITED STATES PATENT OFFICE 2,639,376

AUTOMATIC FREQUENCY CONTROL

Hugh L. Donley and Eugene O. Keizer, Princeton, N. J., assignors to Radio Corporation of America, a corporation of Delaware Application February 25, 1950, Serial No. 146,166

7 Claims. (Cl. 250—20)

Figures 1, 2:
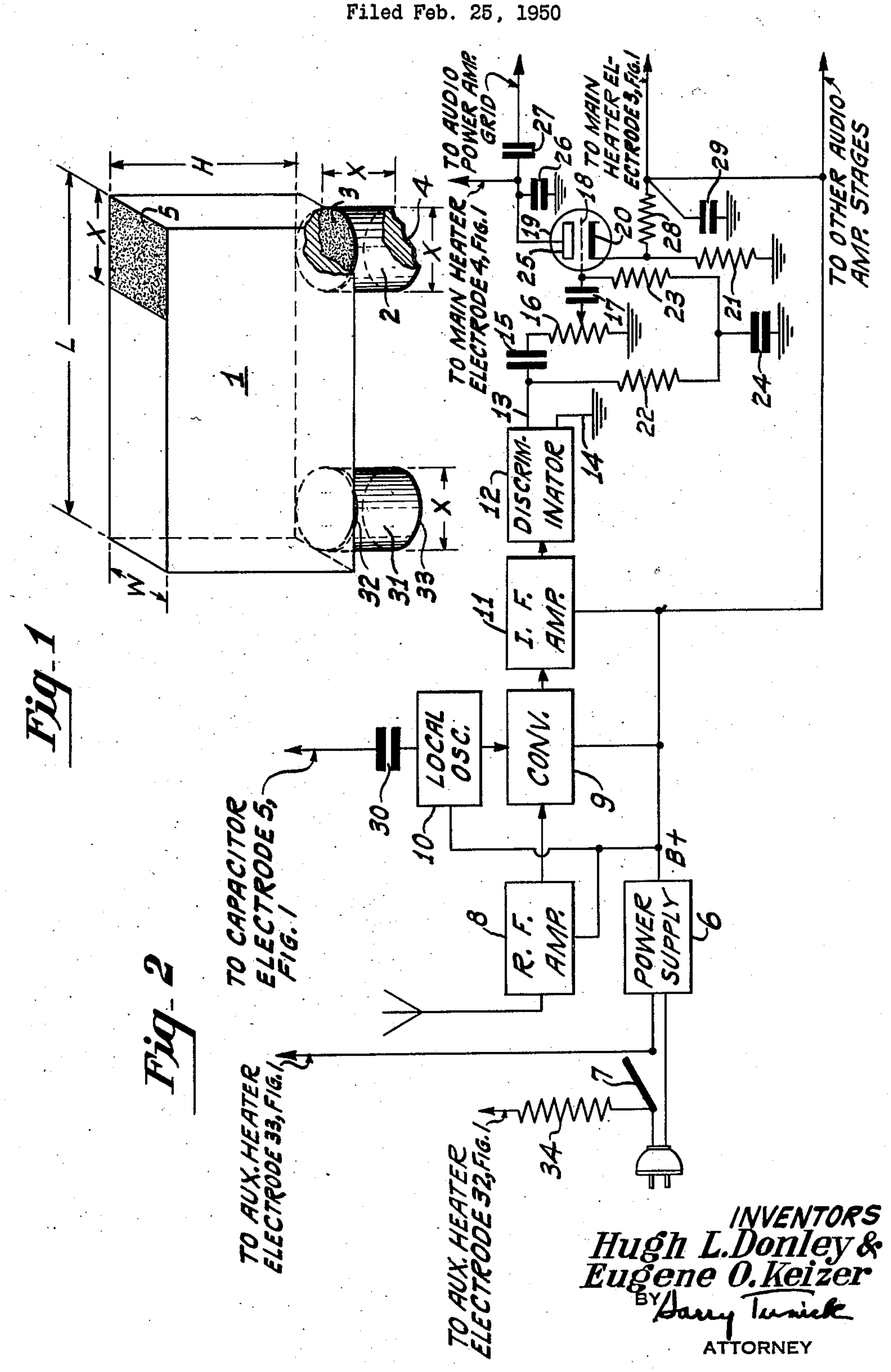

This invention relates to automatic frequency control (AFC) devices, and more particularly to thermal AFC devices which may be used in frequency modulation (FM) radio receivers or in the audio or sound channels of television (TV) receivers.

The usual AFC of an oscillator by means of a reactance tube is of limited use in a FM or TV receiver because of the lack of adequate sensitivity and the loading effect of the reactance tube on the oscillator. Thus, the requirement of additional gain to make the reactance tube feasible as an AFC for FM or TV receiver application is practically ruled out by cost considerations alone. The limitations of the usual reactance tube circuits necessitated the development of a special tube, the transitrol, for AFC purposes. The difficulty of such inherently instantaneous AFC devices, when applied to FM receivers at least, is the possibility of channel "skipping" when the FM receiver is manually tuned.

The AFC action could be slowed down by means of a thermal device depending for example upon the motion of a bimetallic strip to control the oscillator frequency. In general, a device of this sort, or in fact most thermal devices, would be impractical because of the long time constant involved, poor power sensitivity and the tendency to be microphonic.

A thermal AFC arrangement according to this invention overcomes the above-described objections by providing a simple, cheap, small, sensitive device whose time constant is long enough as compared to instantaneous AFC systems to permit easy and accurate manual tuning of a FM receiver and is yet short enough as compared to other thermal AFC systems to be of no disadvantage.

According to this invention, the extremely large temperature coefficient of capacitance of certain compositions of barium strontium titanate over certain ranges of temperature is utilized. The titanate dielectric is maintained in intimate thermal contact with a very small heater element so that the capacitance of the dielectric element rapidly varies in response to changes in temperature produced by changes in current flow through the heater element. When this heater current is controlled from the discriminator of a FM or TV receiver, this current will be proportional to the frequency shift of the local heterodyne oscillator. This frequency shift or drift is then corrected automatically through the change in the capacitance of the dielectric element, which capacitance is coupled to the local oscillator circuit. Since the current or control power for heating the capacitor is derived from the output of the discriminator, with say one stage of D. C. amplification, the heater should have a high resistance to match the amplifier stage, or in other words so that it can serve as the plate resistor of the amplifier stage. Although barium strontium titanates have been mentioned, other dielectrics will function in the desired manner, as long as the dielectric constants of these other dielectrics vary with temperature. Such other dielectrics ordinarily are of less sensitivity, however.

In tests conducted on the action of such a unit as that just described (comprising a high-temperature-coefficient-of-capacitance titanate dielectric element in intimate thermal contact with a small high resistance heater element), when applied to a FM receiver, it was found that it would be desirable to have the thermal AFC unit sufficiently slow-acting to permit the receiver to be manually tuned in a normal manner, after which the AFC action would correct any mistuning or subsequent oscillator drift. It was found that to accomplish this purpose (since the time constant of any thermal device depends on its thermal capacity or roughly the mass of the device), there was required a thermal AFC unit which took approximately one minute to warm up to its operating temperature after the receiver was turned on. In this connection, it is desired to be pointed out that the capacitor should be operated well above room temperature, and in fact above the ambient temperature in the receiver, to render such capacitor unaffected by ambient temperature changes and to eliminate the necessity for careful thermal shielding of the capacitor. The start-up time of the receiver itself, however, from energization to operation, was found to be only about 15–20 seconds.

One difficulty encountered when the warm-up time of the AFC unit exceeds the start-up time of the receiver itself is that the oscillator frequency may be at one extreme of its control characteristic (corresponding to a relatively low temperature of the control capacitor) when a signal is first received, and if a signal is present at this time the resulting AFC action holds the oscillator in this undesirable position. Another manifestation of the same effect may be noticed when the FM receiver is turned on a minute or two after it has been turned off while properly tuned to one of two closely spaced signals. When turned on, the receiver may select the wrong signal.

One solution to the aforementained difficulty might be to delay the start-up of the receiver for a minute or so; however, this would be an undesirably long period.

Therefore, an object of this invention is to make possible, for FM uses, a fast start-up time receiver having a slow-acting AFC system.

The foregoing and other objects and advantages of the present invention will be best understood from the following description of an exemplification thereof, reference being had to the accompanying drawing, wherein:

Fig. 1 is a perspective view, particularly broken away, of a thermal AFC unit according to this invention; and Fig. 2 is a circuit diagram of a FM receiver wherein the unit of Fig. 1 may be utilized.

The objects of this invention are accomplished, briefly, in the following manner:

A dielectric element having a high temperature coefficient of capacitance is provided in thermal contact with a heater element the current through which is controlled by the D. C. output of a discriminator in a FM receiver. The capacitance of the dielectric element is coupled to the tank circuit of a local oscillator in the receiver to control the frequency of such oscillator. An auxiliary or additional heater, energized from the power source, is provided to maintain the dielectric element at its operating temperature when the receiver is turned off.

Certain titanate materials, such as a mixture of barium and strontium titanates, possess very high dielectric constants (on the order of 10,000, for example) and in addition possess a definite critical (Curie) temperature above and below which the dielectric constant rapidly decreases. The position of the Curie temperature on the temperature scale depends on the composition of the titanate material; as the strontium content of the barium-strontium titanate composition is increased the point of maximum dielectric constant moves down on the temperature scale in approximately linear fashion. For the composition 70% $BaTiO_3$–30% $SrTiO_3$ the Curie temperature comes just about at room temperature. Occasionally, it may be desirable to add a small amount of calcium titanate to the barium-strontium titanate composition; this small amount of calcium titanate gives at 100 mc. a capacitor with somewhat lower loss then the straight 70/30 barium-strontium titanate composition. With these titanate materials, there is an extremely rapid drop in capacitance at temperatures above the Curie temperature; with such titanate compositions as that previously described, there is an extremely high temperature coefficient of capacitance.

Above the Curie temperature the dielectric losses are reduced and the nonlinear properties of the dielectric disappear. On the low temperature side of the Curie point the dielectric losses increase and nonlinear electrical characteristics become pronounced. Therefore, to avoid these losses and dielectric anomalies and also to minimize ambient temperature effects, operating temperatures well above the Curie point are preferable. However, at temperatures below the Curie temperature the dielectric constant drops as the temperature changes in roughly the same fashion as for temperatures above the Curie point, so that such temperatures are usable for the device.

As a typical example, a dielectric chosen for the capacitive element in the thermal AFC device of this invention may have the composition 70% barium titanate – 30% strontium titanate and may be operated at a temperature of roughly 40° C., an operating temperature well above ambient temperature in a FM receiver. Such a capacitive element is illustrated at 1 in Fig. 1 as being a rectangular prism of length L, width W and height H. At this operating temperature of 40° C. the dielectric is very sensitive to temperature changes, as exemplified by a temperature coefficient of capacitance of some 30,000 parts per million per degree C. Consequently, the very large temperature coefficient of capacitance together with the high dielectric constant of this material even when operated at a temperature well above room temperature make possible a very small, very sensitive thermal element of low thermal capacity so that temperature changes can be rapidly followed provided a low thermal capacity heating device is used. Element 1 is shown greatly exaggerated in Fig. 1. In a typical example, L was 250 mils, H was 130 mils and W was 40 mils.

In general, heating the temperature-responsive capacitor by means of a detached space type heater would result in too great a thermal lag for most circuit applications. A metal-type heater soldered directly to the dielectric element meets the requirement of high thermal conductivity between heater and capacitor and is satisfactory in those applications where low resistance is permissible. In the applications of chief concern here, however, such as the application to a FM receiver, the mass and size of the unit must be kept small, and in such applications the control power to heat the small capacitor is preferably obtained from the plate circuit of a vacuum tube. Hence, the heater should have a high resistance to match the tube resistance. In addition, good thermal conductivity between the dielectric and heater must be maintained.

In order to satisfy the requirement of high resistance per unit volume, a semiconductive heater element 2 is used, this element being composed, for example, of magnetite ($Fe_3O_4$) and barium strontium titanate in the correct proportion to give the desired high resistance value in the chosen small volume of heater. The resistance for a given volume varies over wide limits in accordance with the magnetite to titanate proportions. For example, the resistivity of the heater can be changed from about 32,000 ohm-cm. for 10% $Fe_3O_4$ and 90% 70/30 (Ba/Sr) $TiO_3$ to 32 ohm-cm. when the magnetite percentage is increased to 90%. Consequently, with such a device the capacitance changes rapidly with small changes in heater power and yet it is possible to match the heater resistance to the plate resistance of a control tube, for example, without increasing appreciably the mass of the heater. For a convenient size heater, such as one 40 mils in diameter and 40 mils in length, which may be the size indicated in Fig. 1, a heater composition of 30% $Fe_3O_4$ and 70% (Ba/Sr) $TiO_3$ gives a resistance of about 150,000 ohms at a heater current of roughly ½ to 1 milliampere at the operating temperature of 40° C. or where the capacitance of the thermal AFC unit is one-half its room temperature or "cold" value. Magnetite, a typical semiconductor, possesses a very large negative temperature coefficient of resistance as a consequence of which the heater resistance drops several fold as the current through the heater is increased. The preparation and characteristics of such a heater are more fully described in the copending Carlson et al. application, Serial No. 704,016, filed October 18, 1946, now Patent #2,528,113, dated October 31, 1950.

It has been found that a semiconductive heater may also be made by introducing the correct amount (for a desired resistant) of copper titanate to iron oxide ($Fe_2O_3$) and then firing at a high temperature. A 60% $CuTiO_3$ – 40% $Fe_2O_3$ composition has been found satisfactory for heaters. Other compositions could also be used for heaters.

As previously stated, heater element 2 may be of cylindrical configuration, and may for example have a diameter X of 40 mils (equal in this example to the dimension W) and a length X of 40 mils. Each circular end face of element 2 is equipped with a fired-on silver electrode, obtained by firing at 750°–800° C. a silver paste applied to such faces. These electrodes cover such end faces, the upper end electrode being indicated at 3 and the lower end electrode at 4. The capacitive or dielectric element 1 is also equipped on its bottom face with a fired-on silver electrode aligned with electrode 3. In order to fasten elements 1 and 2 together and to provide the intimate thermal contact desired, the capacitive element 1 and the main heater element 2 are then sweated together with a small amount of soft solder, the heater element 2 thus being secured to the lower of the two faces defined by dimensions L and W, at one end of such face, in intimate thermal contact with the capacitive element 1. Since the diameter X of the heater element is equal to the width W of the capacitive element, the heater element's circular end face extends from side to side of the capacitive element. In order to provide electrical connections to electrodes 3 and 4, short lengths of copper leads 1 to 3 mils in diameter (not shown in Fig. 1) are soldered to such electrodes to provide supporting connections of low thermal but high electrical conductivity.

As previously stated, the time constant of any thermal device depends on its thermal capacity or roughly the mass of the device. For use in a FM receiver, it is desirable to have the thermal AFC unit sufficiently slow-acting to permit the receiver to be manually tuned in a normal manner, after which the AFC action would correct any mistuning or subsequent oscillator drift. The dimensions of the dielectric element and heater element previously stated in connection with Fig. 1 were found to give about the right mass of unit to provide a control time (the time required for the AFC to retune the receiver when the tuning of the receiver slowly drifted) of roughly 10–15 seconds. However, it was found that a dielectric element of this size had a larger capacitance than was needed for the control of the particular oscillator with which the element was to be used; only a fraction of this capacitance was desired to be coupled to the oscillator. Therefore, a fired-on silver electrode 5, similar to electrodes 3 and 4, is applied to only a portion of the upper face of element 1, electrode 5 extending over the full width W of the element but having a length X small in comparison to length L of element 1, length X being 40 mils, for example. A dielectric element 1 having the dimensions stated above has a warm-up time (the time required to reach the operating temperature of about 40° C.) of 1—1½ minutes.

Now referring to Fig. 2, which shows in part schematic and part detailed form a circuit diagram of a FM receiver utilizing this invention, a power supply 6, energized from the power line through a series main power switch 7, supplies plate voltage to all tubes of the receiver, the plate voltage lead being labeled B+. The heaters of all tubes are energized when switch 7 is closed. The receiver includes in cascade, in the signal channel, RF amplifier 8, a converter stage 9 to which is supplied heterodyning energy from a local oscillator 10, IF amplifier 11 and a discriminator or ratio detector 12 which has a pair of output leads 13 and 14, lead 14 being grounded. When the receiver is in operation, the discriminator 12 will, at any instant of time, supply voltages across leads 13 and 14 which include a D. C. component. This component, unless it is of zero magnitude, will have some finite positive or negative value. The magnitude and polarity of this component are responsive to slow changes in frequency, from a predetermined value, of the mean signal frequency fed to discriminator 12.

Across leads 13 and 14 will also apear, as is well-known to those skilled in the art, audio frequency modulating voltages. The audio frequency voltages are coupled over condenser 15, volume control potentiometer 16 and condenser 17 onto the grid 18 of the first audio stage amplifier tube 19 the cathode 20 of which is grounded through resistor 21. The D. C. component of the discriminator output voltage is coupled through resistors 22 and 23 onto control grid 18 of tube 19, which is thus used as a control or D. C. amplifier tube, the resistors 22 and 23 being connected in series between output lead 13 and grid 18; a radio frequency (RF) bypass condenser 24 is connected from ground to a point between resistors 22 and 23. Plate 25 of tube 19 is connected to main heater electrode 4 of heater 2, while heater electrode 3 is connected to the B supply; in this way, the plate load resistance or output resistance of tube 19 is the main heater 2 of the AFC unit. A RF bypass capacitor 26 is connected from ground to plate 25, while the amplified audio frequency voltage is coupled through condenser 27 to the grid of the following audio stage.

Fixed bias is applied to the cathode 20 by any suitable arrangement, for example by means of a bleeder resistor 28 from the positive supply lead in combination with resistor 21, a RF bypass condenser 29 being connected from such positive lead to ground. Resistor 28 is used to set the initial or operating bias on tube 19 such that the initial plate current through the main heater 2 (when the receiver is energized) maintains the operating temperature of the capacitor 1 (for example, 40° C.) well above ambient temperature when there is a zero or correct tuning point control voltage out of the discriminator, thereby eliminating the necessity for careful thermal shielding of the capacitive element. Although 40° C. has been mentioned as the operating temperature, it is to be understood that in some cases (for example, in TV receivers wherein the ambient temperature in the receiver is generally higher than in FM receivers) the operating temperature of the unit may be much higher, for example 100° C.

The power requirement of the heater 2 is small, and, as previously stated, the resistivity of the heater material may be so chosen that the function of D. C. amplification may be accomplished in one of the existing tubes in the receiver. For example, heaters with resistances on the order of 100,000 ohms operating at about 0.5 to 1.0 milliampere are well suited for use in place of the plate load resistors of commonly-used high-mu triode first audio amplifier tubes. Other possibilities with different resistances for the heater may be as screen or cathode resistors for control tubes.

Although it has been stated that the heater element may be used as the plate load resistor or screen resistor or cathode resistor of control tubes (depending on the resistance of such heater, which may be predetermined by its composition, as previously discussed) it has been found preferable to employ a high resistance heater and to utilize such heater as the output load for the control tube; if this is done, greater sensitivity of control results than would be the case if the heater were connected elsewhere in the control tube circuit. For example, if the heater were placed in the cathode circuit of the tube, a loss in sensitivity of control occurs when a plate resistor is used since the heater and plate resistor are then in series. Also, by utilizing the heater element as output load or plate load for the control tube, the gain of such tube as an amplifier is not impaired.

The capacitor element 1 is connected into the tank circuit of local oscillator 10 of the superheterodyne FM receiver by a connection which extends from capacitor electrode 5 through a series capacitor 30 to the plate of the tube in oscillator 10. In this way, the capacitive element 1 is made part of the oscillator circuit of the receiver. By virtue of the RF bypass condenser 29 connected to electrode 3, the capacitance of the dielectric element 1 between the opposite electrodes 3 and 5 appears in effect between electrode 5 and ground.

We will assume that when the receiver is first energized by closing switch 7, the capacitor 1 is substantially at its operating temperature. This is a valid assumption, as will hereinafter appear. The titanate capacitor-heater unit 1, 2 is then ready to function as a frequency control for the oscillator when the receiver is first operative. The tube capacitors and circuit constants of the oscillator 10 will continue to change for some time after the receiver is turned on, thereby to cause the D. C. component of the discriminator output voltage to change from a zero value. If the discriminator output voltage polarity with regard to frequency change at its input has been correctly predetermined, this change in discriminator output voltage will cause the temperature of the titanate capacitor 1 to change in the proper direction to counteract the change in other circuit components of the oscillator 10. For example, if the discriminator polarity is such that an increase in the mean intermediate frequency applied thereto applies a negative voltage to grid 18 to reduce the heater 2 current, the temperature of the capacitor 1 will decrease and the capacitance of such capacitor will increase, thus decreasing the frequency of the local oscillator 10; this change is in the correct direction to counteract the original slow change in mean intermediate frequency. In those receivers where the local oscillator frequency is lower than the signal frequency the polarity of the discriminator should be reversed from that given above.

Because of the control time or time constant of the Fig. 1 unit (10–15 seconds) the manual tuning process is similar to that in a receiver with no AFC and hence there is little tendency to "hold" on a strong station and jump over an adjacent weak one. Thus, the operator can immediately tune in a station and the AFC action will compensate for tendencies of the oscillator to drift. If when the receiver is first operative the tuning point is nearly correct for a particular station, the AFC action will correct the tuning of the oscillator in the proper direction to tune to the station.

Good over-all operation has been experienced where the coupling of the capacitive section 1 of the unit to the local oscillator 10 is such that about a two-to-one change in capacitance of the unit is required for the desired range of control. Series capacitor 30 between the oscillator 10 and the capacitive section 1 of the AFC unit is a convenient way to reduce the coupling to the oscillator circuit. The desired coupling can be calculated from a consideration of the circuit capacitance and the AFC unit capacitance values.

The above discussion has proceeded on the assumption that when the receiver is first turned on, the thermal capacitor 1 is substantially or essentially at its operating temperature. It has been found, according to this invention, that if the warm-up time of the AFC unit exceeds the start-up time of the receiver itself (which is the case in the Fig. 1 unit, where the warm-up time of the capacitor 1 is 1–1½ minutes and the start-up time of the receiver is 15–20 seconds), certain difficulties ensue. One difficulty is that the oscillator frequency may be at one extreme of its control characteristic (corresponding to a relatively low temperature of the control capacitor) when a signal is first received, and if a signal is present the resulting AFC action holds the oscillator in this undesirable position. Another difficulty is that, when the receiver is turned on after it has been turned off while tuned to one of two closely spaced signals, it may select the wrong signal.

To delay start-up of the receiver would be impractical.

According to this invention, an auxiliary heater is provided on the AFC unit, which heater maintains the capacitive element essentially at its operating temperature while the receiver is deenergized, so that the AFC unit assumes control within 15 seconds after the receiver is turned on (i. e., the receiver start-up time). Referring again to Fig. 1, the auxiliary heater 31 is preferably of the same size and configuration as the main heater 2 previously described, and is preferably similar to such main heater in all respects, having electrodes 32 and 33 similar to electrodes 3 and 4 on its upper and lower circular end faces, respectively. Auxiliary heater 31 is secured to dielectric block 1 in intimate thermal engagement therewith, preferably on the end of the block's bottom face opposite to main heater 2, as illustrated.

In order to energize the auxiliary heater 31 in such a way that the heater draws a small amount of current from the 110-volt A. C. power line when the receiver power is off, thereby to maintain element 1 at its operating temperature while the receiver is off, a lead extends from one side of power switch 7 to auxiliary heater electrode 33, and a lead extends from the other side of switch 7 (through a series resistor 34 if desired, to apply only an adjustable portion of the 110 volts to heater 31) to auxiliary heater electrode 32. Instead of a series resistor 34, a series capacitor can be used if desired.

When the receiver is off (switch 7 open) auxiliary heater 31 is energized from the 110-volt line to maintain element 1 substantially at its operating temperature. When the receiver is turned on, the on-off switch 7 is closed, shunting out the auxiliary heater 31 and removing the 110-volt supply from such heater just prior to the energization of the regular or main heater 2.

Since by the use of this auxiliary heater the operating temperature of the dielectric element is maintained when the receiver is turned off, the AFC unit is up to its operating temperature and ready to function as soon as the receiver itself starts up; therefore, by using this scheme the normal receiver start-up time of about 15 seconds can be maintained, even though the dielectric element has a warm-up time of 1–1½ minutes.

Tests with a unit of the type illustrated in Fig. 1 installed in a FM receiver showed that the station to which the receiver was tuned when it was turned off would invariably also be the one automatically selected when the receiver was turned on, even if there were another closely spaced signal. Also, with this construction the AFC action holds the oscillator substantially in the mid-portion of its control characteristic.

It is desired to be made clear at this point that, although the auxiliary heater 31 is energized during the entire time that the receiver is off, the power consumed thereby is inconsequential, since such heater draws on the order of only 20 milliwatts of power. Also, during the operation of the receiver, only this very small power is necessary to heat element 1 for AFC purposes. Although there is a closed series circuit from the power line to power supply 6 through auxiliary heater 31 when switch 7 is open, this is a very high resistance circuit and the amount of current flowing therethrough (e. g., 0.2 ma. as compared to at least 500 ma. when switch 7 is closed to energize the receiver) is entirely insufficient to produce any energization of the rectifiers in power supply 6 at this time.

It has been found that the effect of variations in line voltage on the AFC action is very small. In a test, using a "Variac" to control the line voltage, it was found that neither slow nor rapid variations from 80 to 130 volts caused a noticeable effect in the output signal except for a slow change of volume due to the change of gain in the FM receiver.

The small change in plate current (in tube 19) necessary to vary the capacitance of the titanate capacitor in accordance with the D. C. component of the discriminator output voltage does not change the audio gain of this stage appreciably, so that the audio stage tube may also be used as an AFC control tube. In a test of a device constructed according to this invention, in a FM receiver manufactured by applicants' assignee, the local oscillator frequency was changed approximately 350 kc. per volt of change at the discriminator or ratio detector output. The control range of the receiver was about ±200 to ±500 kc. for normal signal strength encountered in the Princeton area, say 100 microvolts.

Although the emphasis in the foregoing has been on a circuit application of a thermal capacitor for AFC purposes, other circuit applications are possible. For example, it is possible to change the oscillator tuning by the simple expedient of varying the initial bias on the control tube 19. In addition to the oscillator tuning, AFC action about any given bias or capacitance value is also possible when the discriminator 12 is employed. By adding another capacitance section to the thermal capacitor the RF stage 8 as well as the local oscillator 10 could be tuned by the change in bias of the control stage. For the FM band, for example, the required tuning range is possible with only one to two volts change in bias on a type 6AT6 tube as the control stage tube 19. It has been found possible to readily obtain better than a ten-to-one change in capacitance for 0.6 watt heater power in a fairly massive unit. It may be seen that remote tuning of oscillator 10 can be accomplished merely by changing the bias on control stage 19.

What we claim to be our invention is:

1. In a radio receiver adapted to be energized at will from a source of power through a switch, signal-responsive means operative in response to closing of said switch to produce an output voltage in response to a slow change, from a predetermined frequency, in the frequency of the signal fed thereto, a controllable-frequency generator in said receiver for varying the frequency of the signal fed to said means, a capacitive element the capacitance of which varies with the temperature thereof, controllable means for heating said element, means responsive to said produced voltage for controlling the heating effect of said heating means, means coupling said element to said generator, the arrangement being such that the frequency of said generator is controlled, thereby varying the frequency of the signal fed to said signal-responsive means, in response to variations in capacitance of said element, and means energized in response to deenergization of said receiver for heating said element, thereby to maintain said element substantially at a predetermined temperature during periods of deenergization of said receiver.

2. A radio receiver as defined in claim 1, wherein the last-mentioned means is an electrical heater element in intimate thermal contact with the capacitive element and wherein such heater element is connected across the said switch.

3. In a radio receiver adapted to be energized at will from a source of power through a switch, signal-responsive means operative in response to closing of said switch to produce an output voltage in response to a slow change, from a predetermined frequency, in the frequency of the signal fed thereto, a controllable-frequency generator in said receiver for varying the frequency of the signal fed to said means, a capacitive element the capacitance of which varies with the temperature thereof, an electrical heater element in intimate thermal contact with said capacitive element, means responsive to said produced voltage for controlling the current through said heater element, means coupling said capacitive element to said generator, the arrangement being such that the frequency of said generator is controlled, thereby varying the frequency of the signal fed to said signal-responsive means, in response to variations in capacitance of said capacitive element, and means energized in response to denergization of said receiver for heating said capacitive element, thereby to maintain such element substantially at a predetermined temperature during periods of deenergization of said receiver.

4. A radio receiver as defined in claim 3, wherein the last-mentioned means is another electrical heater element in intimate thermal contact with the capacitive element and wherein such other heater element is connected across the said switch.

5. In a tunable receiver adapted to be energized at will and having a predetermined start-up time, a temperature-responsive variable capacitor coupled to said receiver to control the tuning of one stage thereof, controllable means operative in response to energization of said receiver for heating said capacitor to a predetermined operating temperature, said capacitor having a warm-up time, from room temperature to said operating temperature, which exceeds the receiver start-up time, a discriminator in said receiver having its input coupled to said one receiver stage, means responsive to the output of said discriminator for controlling said heating means to vary the temperature of said capacitor with respect to said operating temperature, and means for maintaining said capacitor substantially at said operating temperature during periods of deenergization of said receiver.

6. In a tunable receiver adapted to be energized at will from a source of power through a switch and having a predetermined start-up time, a temperature-responsive variable capacitor coupled to said receiver to control the tuning of one stage thereof, an electrical heater element in intimate thermal contact with said capacitor, said element being operative in response to energization of said receiver for heating said capacitor to a predetermined operating temperature, said capacitor having a warm-up time, from room temperature to said operating temperature, which exceeds the receiver start-up time, a discriminator in said receiver having its input coupled to said one receiver stage, means responsive to the output of said discriminator for varying the current through said element to vary the temperature of said capacitor with respect to said operating temperature, another electrical heater element in intimate thermal contact with said capacitor, and means connecting said other heater element across said switch, thereby to maintain said capacitor substantially at said operating temperature during periods of deenergization of said receiver.

7. In a tunable receiver adapted to be energized at will, a temperature-responsive variable capacitor coupled to said receiver to control the tuning of one stage thereof, an electrical heater element in intimate thermal contact with said capacitor, a discriminator in said receiver having its input coupled to said one receiver stage, a direct current amplifier tube having a grid coupled to the output of said discriminator and having a plate circuit, means coupling said heater element to said plate circuit as the plate load resistor for said tube, to thereby control the temperature of said capacitor, when said receiver is energized, in dependence upon the direct voltage output of said discriminator, and means energized in response to deenergization of said receiver for heating said capacitor, thereby to maintain the same substantially at a predetermined temperature during periods of deenergization of said receiver.

HUGH L. DONLEY.
EUGENE O. KEIZER.

References Cited in the file of this patent

UNITED STATES PATENTS

| Number | Name | Date |
|---|---|---|
| 1,894,687 | Hyland | Jan. 17, 1933 |
| 2,210,406 | Henderson | Aug. 6, 1940 |
| 2,399,082 | Wainer | Apr. 23, 1946 |
| 2,483,070 | Spindler | Sept. 27, 1949 |